US006881534B2

United States Patent
Kamijima

(10) Patent No.: US 6,881,534 B2
(45) Date of Patent: Apr. 19, 2005

(54) METHOD OF FORMING MASK, METHOD OF FORMING PATTERNED THIN FILM, AND METHOD OF FABRICATING MICRO DEVICE

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 233 days.

(21) Appl. No.: 10/238,624

(22) Filed: Sep. 11, 2002

(65) Prior Publication Data
US 2003/0059722 A1 Mar. 27, 2003

(30) Foreign Application Priority Data

Sep. 25, 2001 (JP) ........................................ 2001-291380

(51) Int. Cl.⁷ ................................................. G03F 7/00
(52) U.S. Cl. ...................... 430/311; 430/312; 430/313; 430/314
(58) Field of Search ................................ 430/311, 312, 430/313, 314

(56) References Cited

U.S. PATENT DOCUMENTS

| | | | | |
|---|---|---|---|---|
| 4,699,870 A | * | 10/1987 | Iwadate et al. | 430/296 |
| 5,240,878 A | * | 8/1993 | Fitzsimmons et al. | 438/670 |
| 5,583,063 A | * | 12/1996 | Samoto | 438/570 |
| 5,721,078 A | | 2/1998 | Kamijima | |
| 5,725,997 A | | 3/1998 | Kamijima | |
| 5,747,198 A | | 5/1998 | Kamijima | |
| 6,303,416 B1 | * | 10/2001 | Bruce et al. | 438/166 |
| 6,406,995 B1 | * | 6/2002 | Hussein et al. | 438/638 |
| 6,455,227 B1 | * | 9/2002 | Hara | 430/273.1 |
| 6,468,898 B1 | * | 10/2002 | Usami | 438/638 |
| 6,514,672 B1 | * | 2/2003 | Young et al. | 430/314 |
| 6,537,732 B1 | * | 3/2003 | Kamijima | 430/311 |
| 6,589,711 B1 | * | 7/2003 | Subramanian et al. | 430/311 |
| 6,692,901 B1 | * | 2/2004 | Kamijima | 430/315 |
| 6,720,132 B1 | * | 4/2004 | Tsai et al. | 430/312 |

FOREIGN PATENT DOCUMENTS

| | | |
|---|---|---|
| EP | 0 341 843 A2 | 11/1989 |
| JP | A 2-17643 | 1/1990 |
| JP | A 9-96909 | 4/1997 |

* cited by examiner

Primary Examiner—Amanda Walke
(74) Attorney, Agent, or Firm—Oliff & Berridge, PLC

(57) ABSTRACT

In a method of forming a mask, initially, a first layer is formed on a base layer. The first layer is made of a material being soluble in a developer used for developing a resist and having a higher removal rate in ashing than the resist. Next, a second layer made of the resist is formed on the first layer, and exposed to light. Next, the second layer is developed and part of the first layer is dissolved using the developer. In this step, the width of the first layer is made equal to or greater than that of the second layer. Next, the width of the first layer is made smaller than that of the second layer through ashing. As a result of the ashing, the first layer makes the lower layer of the mask and the second layer makes the upper layer.

13 Claims, 17 Drawing Sheets

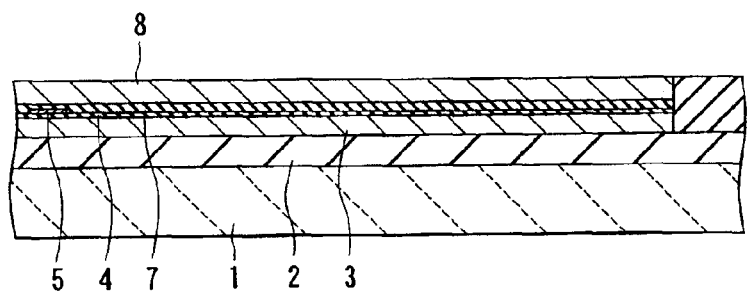 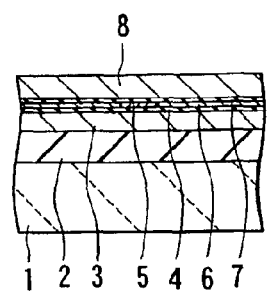
FIG. 21A  FIG. 21B
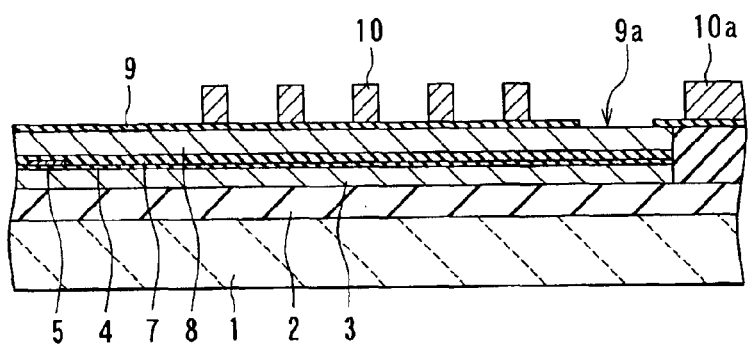 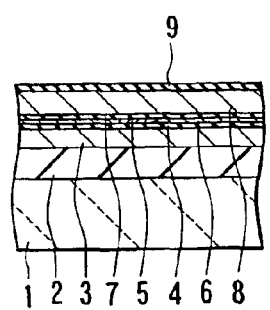
FIG. 22A  FIG. 22B

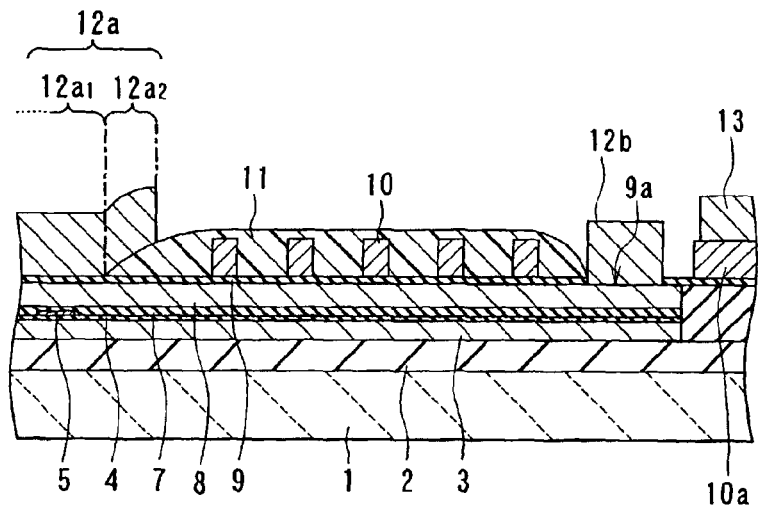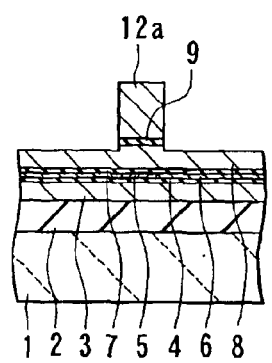
FIG. 23A  FIG. 23B
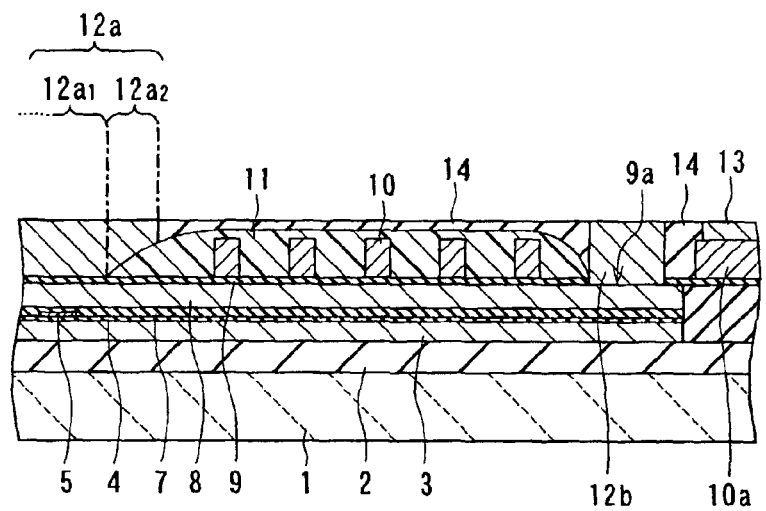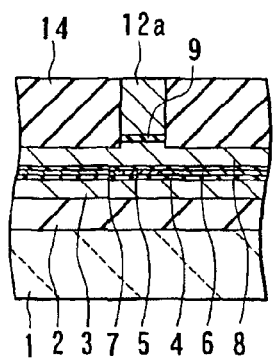
FIG. 24A  FIG. 24B

METHOD OF FORMING MASK, METHOD OF FORMING PATTERNED THIN FILM, AND METHOD OF FABRICATING MICRO DEVICE

BACKGROUND OF THE INVENTION

1. Field of the Invention

The present invention relates to a method of forming a mask of undercut shape, and a method of forming a patterned thin film and a method of fabricating a micro device in which a patterned thin film is formed through the use of the mask.

2. Description of the Related Art

In micro devices having a thin film formed into a specific pattern (called a patterned thin film in this application), the patterned thin film is formed by using, for example, a patterned resist layer as a mask. A micro device means a small-size device fabricated through the use of thin-film forming techniques. Examples of the micro device include semiconductor devices, thin-film magnetic heads, transducers and actuators incorporating thin films.

As disclosed in Published Unexamined Japanese Patent Application (KOKAI) No. Heisei 9-96909 (1997), for example, methods such as etching, liftoff, and a combination of etching and liftoff (hereinafter called a combination method) are available to form a patterned thin film on a base layer by using a patterned resist layer as a mask.

To perform the aforementioned methods, it is preferable to use a mask of undercut shape, that is, a mask in which the bottom portion has a width smaller than that of the upper portion. One of known methods for forming such a mask is to use a two-layer resist, as disclosed in Published Unexamined Japanese Patent Application (KOKAI) No. Heisei 2-17643 (1990).

The method of forming a mask of undercut shape through the use of a two-layer resist will now be briefly described with reference to FIG. 35 to FIG. 38. In this method, as shown in FIG. 35, a first layer 302 that is the lower layer of the two-layer resist is first formed on a base layer 301. Next, as shown in FIG. 36, a second layer 303 that is the upper layer of the two-layer resist is formed on the first layer 302. The second layer 303 is made of a resist. The resist can be any of a negative type resist, a positive type resist, a novolak type resist, a chemically amplified type resist, etc. The first layer 302 is made of a material that is soluble in a developer. The first layer 302 is made of polymethylglutarimide, for example.

Next, as shown in FIG. 37, the second layer 303 is exposed to light for forming a latent image of specific pattern through a mask 304, thereby forming a latent image of specific pattern on the second layer 303. Light used for the exposure may be any of ultraviolet rays, a beam of an excimer laser, an electron beam, etc. Next, as shown in FIG. 38, the second layer 303 having undergone the exposure is developed and part of the first layer 302 is dissolved in the developer to form a mask made up of an upper layer 306 made of the remainder of the second layer 303 and a lower layer 305 made of the remainder of the first layer 302. The development is continued until a width W1 of the first layer 302 on the lower side becomes smaller than a width W2 of the second layer 303 on the upper side. A mask of undercut shape is thus obtained.

In the above-described conventional method for forming a mask of undercut shape through the use of the two-layer resist, when developing the second layer 303, the first layer 302 is dissolved until the width of the first layer 302 becomes smaller than that of the second layer 303. For this reason, in the conventional method, the portion of the first layer 302 bonded to the base layer 301 is reduced in area during the development, which not only reduces adhesiveness between the first layer 302 and the base layer 301, but also reduces mechanical strength of the first layer 302 and the second layer 303. Further, during the development, the flow of the developer or a cleaning solution applies a force to the first and second layers 302 and 303. Therefore, this conventional method has a problem that the first and second layers 302 and 303 are readily peeled off or damaged during the development. This problem becomes noticeable when an attempt is made to obtain a mask having a smaller width. Hence, a mask having a sufficiently small width cannot be obtained by this conventional method. Therefore, it is difficult to obtain a fine patterned thin film by using the mask formed by the above-described method.

OBJECTS AND SUMMARY OF THE INVENTION

It is a first object of the invention to provide a method of forming a mask which allows formation of a mask of undercut shape and of small width while preventing peeling of or damage to layers to make the mask.

It is a second object of the invention to provide a method of forming a patterned thin film and a method of fabricating a micro device which make it possible to form a fine patterned thin film through the use of the above-mentioned mask.

A method of forming a mask according to the invention is provided for forming a mask to be used for forming a patterned thin film, the mask including: an upper layer made of a resist and having a specific width; and a lower layer having a width smaller than the width of the upper layer. The method comprises the steps of: forming a first layer on a base layer, the first layer being made of a material that is soluble in a developer and has a higher removal rate in ashing than the resist; forming a second layer made of the resist on the first layer; exposing the second layer to light for forming a latent image of specific pattern; developing the second layer having undergone the exposure and dissolving part of the first layer using the developer, so that the remainder of the first layer has a width equal to or greater than that of the second layer having undergone the development; and performing ashing on the remainder of the first layer and the second layer having undergone the development, so that the first layer having undergone the ashing has a width smaller than that of the second layer having undergone the ashing, to make the first layer having undergone the ashing serve as the lower layer and the second layer having undergone the ashing as the upper layer.

According to the mask-forming method of the invention, in the step of developing the second layer and dissolving part of the first layer, the width of the remainder of the first layer is made equal to or greater than that of the second layer having undergone the development. As a result, it is possible to prevent peeling of or damage to the first layer and the second layer during the development. Further, in this method, the first layer is made of a material having a higher removal rate in ashing than the resist used for the second layer. In the present application, a removal rate in ashing refers to a thickness of the material removed per unit time. In the mask-forming method of the invention, the first layer and the second layer are subjected to ashing after the developing step, so that the width of the first layer having undergone the ashing is made smaller than that of the second layer having undergone the ashing. A mask of undercut shape is thereby obtained.

A first method of forming a patterned thin film of the invention is provided for forming a patterned thin film through the use of a mask of undercut shape. The method comprises the steps of: forming a film to be patterned on a base layer; forming the mask of undercut shape on the film to be patterned; and forming the patterned thin film from the film to be patterned, by selectively etching the film to be patterned through the use of the mask. In this method, the mask is formed by the mask-forming method of the invention described above.

A second method of forming a patterned thin film of the invention is also provided for forming a patterned thin film through the use of a mask of undercut shape. The method comprises the steps of: forming the mask of undercut shape on a base layer; forming a film to be patterned over an entire surface on top of the base layer and the mask, to thereby form the patterned thin film from the film to be patterned on the base layer; and removing the mask after the patterned thin film is formed. In this method, the mask is formed by the mask-forming method of the invention described above.

A third method of forming a patterned thin film of the invention is provided for forming patterned thin films through the use of a mask of undercut shape. The method comprises the steps of: forming a first film to be patterned on a base layer; forming the mask of undercut shape on the first film to be pattered; forming a first patterned thin film from the first film to be patterned, by selectively etching the first film to be patterned through the use of the mask; forming a second film to be patterned over an entire surface on top of the base layer and the mask after the first patterned thin film is formed, to thereby form a second patterned thin film from the second film to be patterned on the base layer; and removing the mask after the second patterned thin film is formed. In this method, the mask is formed by the mask-forming method of the invention described above.

A method of fabricating a micro device of the invention is to form a micro device including one or more patterned thin films, in which the patterned thin film(s) are formed by the first, second, or third method of forming a patterned thin film of the invention as described above.

In the method of fabricating a micro device of the invention, the micro device may be a thin-film magnetic head. In this case, the patterned thin film may be a magnetoresistive element or a lead layer connected to the magnetoresistive element.

Other and further objects, features and advantages of the invention will appear more fully from the following description.

BRIEF DESCRIPTION OF THE DRAWINGS

FIGS. 21A and 21B are cross sections for illustrating a step of a method of fabricating a thin-film magnetic head of the embodiment of the invention.

FIGS. 22A and 22B are cross sections for illustrating a step that follows FIGS. 21A and 21B.

FIGS. 23A and 23B are cross sections for illustrating a step that follows FIGS. 22A and 22B.

FIGS. 24A and 24B are cross sections for illustrating a step that follows FIGS. 23A and 23B.

DETAILED DESCRIPTION OF THE PREFERRED EMBODIMENTS

A preferred embodiment of the invention will now be described in detail with reference to the accompanying drawings.

A method of forming a mask according to an embodiment of the invention will now be described with reference to FIG. 1 through FIG. 8. The method is, as shown in FIG. 6, to form a mask 110 of undercut shape that is to be used for forming a patterned thin film. The mask 110 includes an upper layer 112 made of a resist and having a specific width, and a lower layer 111 having a width smaller than that of the upper layer 112.

Figure 1:
FIG. 1 is a cross section for illustrating a step of a method of forming a mask of an embodiment of the invention.

In the mask-forming method of the embodiment, as shown in FIG. 1, a first layer 102 is first formed on a base layer 101 such as a substrate. The first layer 102 is made of a material being soluble in a developer used for developing the resist and having a higher removal rate in ashing than the resist. For example, polymethylglutarimide is used as the material of the first layer 102. The first layer 102 is formed by, for example, applying the material of the first layer 102 to the base layer 101 and applying heat as needed.

Figure 2:
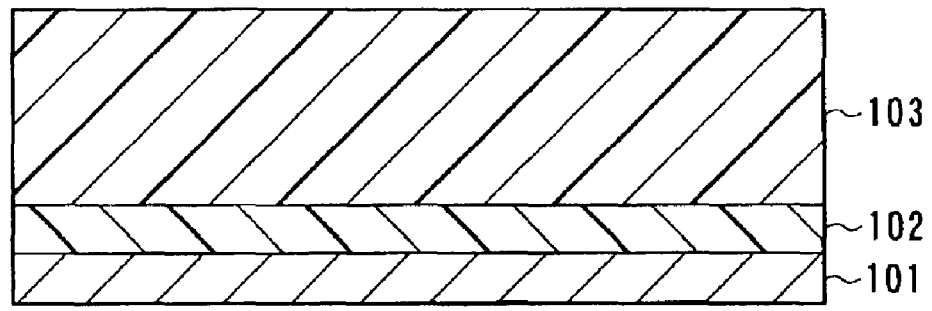
FIG. 2 is a cross section for illustrating a step that follows FIG. 1.

Next, resist is applied to the first layer 102 and heat treatment is performed, thereby forming the second layer 103 as shown in FIG. 2. The resist can be any of a negative type resist, a positive type resist, a novolak type resist, a chemically amplified type resist, etc.

Figure 3:
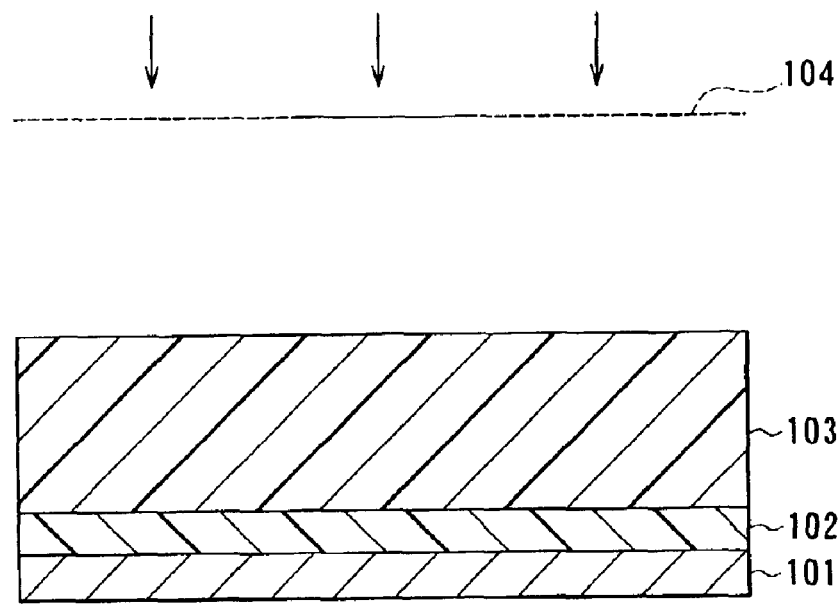
FIG. 3 is a cross section for illustrating a step that follows FIG. 2.

Next, as shown in FIG. 3, the second layer 103 is exposed to light for forming a latent image of specific pattern through a mask 104 to form a latent image of specific pattern on the second layer 103. Light used for the exposure may be any of ultraviolet rays, a beam of an excimer laser, an electron beam, etc. The second layer 103 may be heated after the exposure, as necessary.

Figure 4:
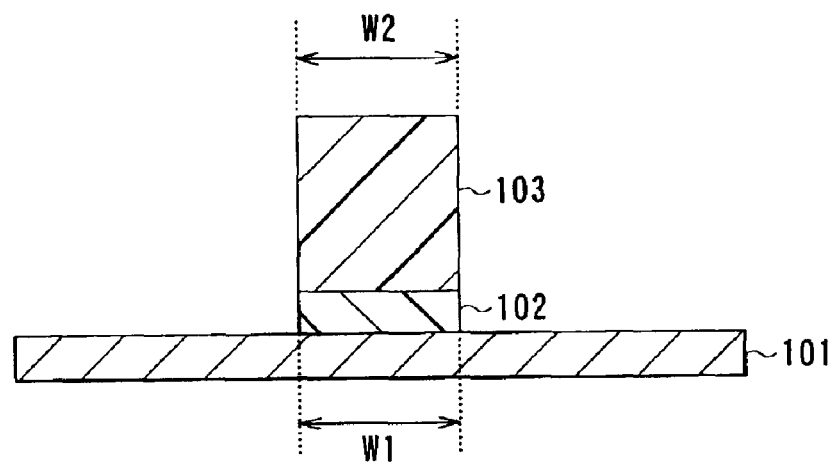
FIG. 4 is a cross section for illustrating a step that follows FIG. 3.
Figure 5:
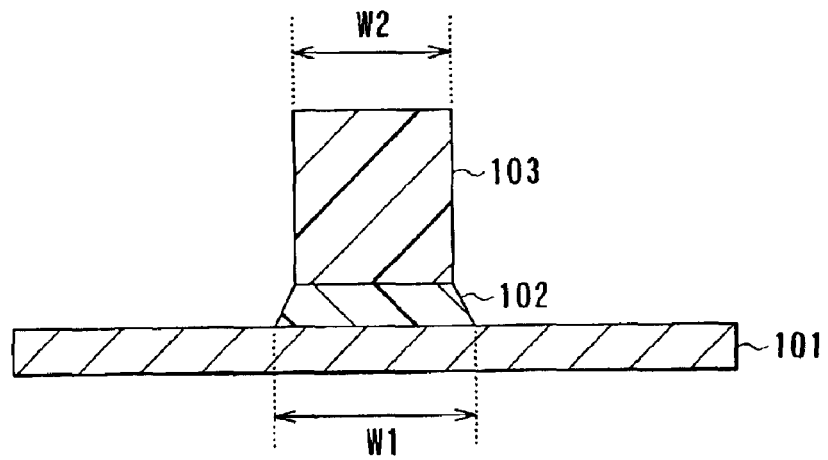
FIG. 5 is a cross section for illustrating a step that follows FIG. 4.
Figure 6:
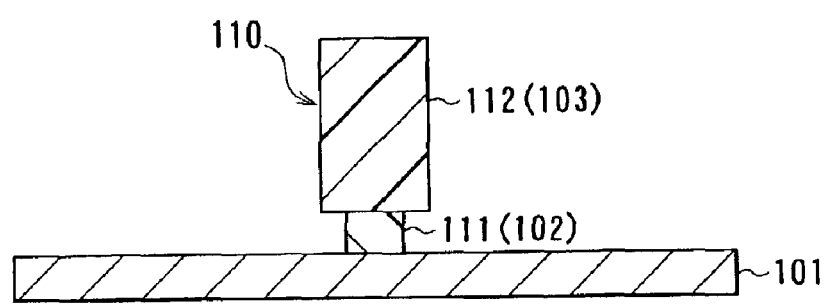
FIG. 6 is a cross section for illustrating a step that follows FIG. 5.

Next, as shown in FIG. 4 or FIG. 5, the second layer 103 having undergone the exposure is developed and part of the first layer 102 is dissolved using the developer. In this step, a width W1 of the remainder of the first layer 102 is made equal to or greater than a width W2 of the second layer 103 having undergone the development. FIG. 4 shows a state in which the width W1 of the remainder of the first layer 102 is equal to the width W2 of the second layer 103 having undergone the development. FIG. 5 shows a state in which the width W1 of the remainder of the first layer 102 is greater than the width W2 of the second layer 103 having undergone the development. After the development, the first layer 102 and the second layer 103 are rinsed with water and then dried.

Next, as shown in FIG. 6, the widths of the first layer 102 and the second layer 103 are narrowed by performing ashing on the remainder of the first layer 102 and on the second layer 103 having undergone the development. Ashing is a procedure for removing a material such as a resist in a vapor phase. As described above, the first layer 102 is made of a material having a higher removal rate in ashing than the resist used for making the second layer 103. The ashing is performed on the first and second layers 102 and 103 so that the first layer 102 having undergone the ashing has a width smaller than that of the second layer 103 having undergone the ashing. The first layer 102 having undergone the ashing makes the lower layer 111 of the mask 110. The second layer 103 having undergone the ashing makes the upper layer 112 of the mask 110. The mask 110 of undercut shape is thus obtained.

An example of the conditions for ashing will now be described. In this example, System 104 (product name) of Matrix Inc. is employed as an ashing device. A pressure inside the ashing chamber is 1.0 Torr (approximately 133 Pa). $O_2$ is used as a gas, at a flow rate of 30 sccm. An RF output is 200 W. A substrate temperature is 70° C. An ashing time is 120 seconds. The gas may be $O_2$ to which $CF_4$ is added. The gas may also be ozone. In this case, ashing may be conducted at normal atmospheric pressure.

Figure 7:
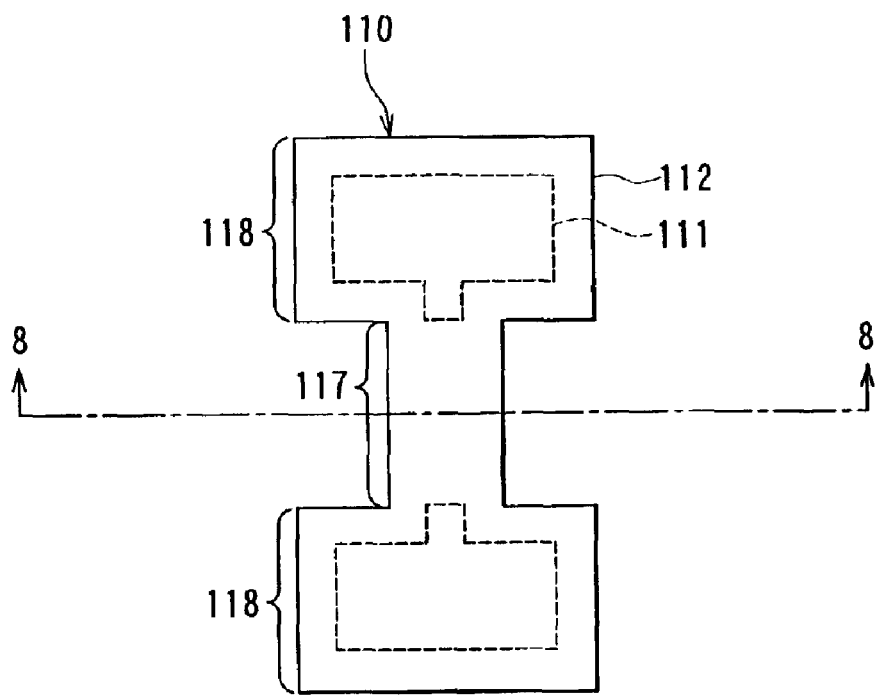
FIG. 7 is a top view for illustrating an example of the mask of the embodiment of the invention.
Figure 8:
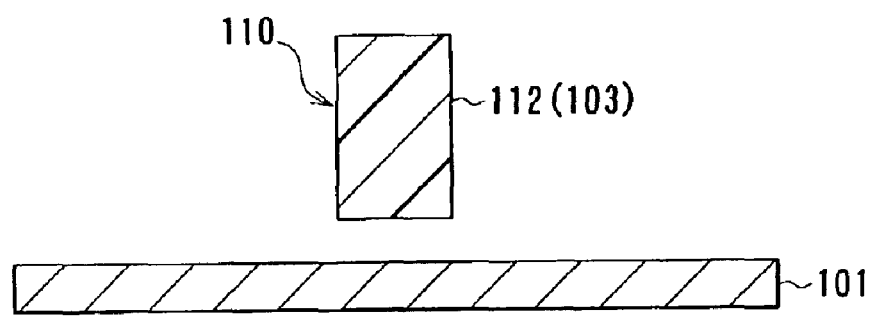
FIG. 8 is a cross section taken along line 8—8 of FIG. 7.

In the embodiment, as shown in FIGS. 7 and 8, the upper layer 112 of the mask 110 may be formed to extend over a portion corresponding to the patterned thin film to be formed and other portions, and the lower layer 111 may be formed only in the other portions. FIG. 7 is a plan view of the mask 110. FIG. 8 is a cross section taken along line 8—8 of FIG. 7. In this example, as shown in FIG. 7, the upper layer 112 of the mask 110 is formed to extend over the portion 117 corresponding to the pattered thin film to be formed and other portions 118, and the lower layer 111 is formed only in the other portions 118. Therefore, the entire mask 110 is bridge-shaped.

According to the method of forming a mask of the embodiment, as described above, in the step of developing the second layer 103 and dissolving part of the first layer 102, the width W1 of the remainder of the first layer 102 is made equal to or greater than the width W2 of the second layer 103 having gone through the development. As a result, according to the embodiment, the portion of the first layer 102 bonded to the base layer 101 is increased in area as compared with the case of the conventional mask-forming method in which the width W1 of the first layer 102 is made smaller than the width W2 of the second layer 103 during development. Therefore, according to the embodiment, better adhesiveness is achieved between the first layer 102 and the base layer 101 than in the case of the conventional mask-forming method. It is thus possible to prevent peeling of the first layer 102 and the second layer 103 off the base layer 101 during development. Also, in the embodiment, because the first layer 102 has the width W1 that is equal to or greater than the width W2 of the second layer 103 when developed, the first layer 102 and the second layer 103 have greater mechanical strength than in the case of the conventional mask-forming method. Therefore, according to the embodiment, it is possible to prevent damage to the first layer 102 and the second layer 103 during development.

Also, in the embodiment, the first layer 102 and the second layer 103 are subjected to ashing after the developing step, so that the first layer 102 having undergone the ashing has a width smaller than that of the second layer 103 having undergone the ashing. The mask 110 of undercut shape is thus obtained. Since the procedure for narrowing the widths of the first and second layers 102 and 103 by ashing is performed as a vapor-phase reaction, no force is applied to the first and second layers 102 and 103 during the ashing. As a result, while the width of the first layer 102 is made smaller than that of the second layer 103, it is still possible to prevent peeling of or damage to the first and second layers 102 and 103 during the ashing.

In view of the foregoing, according to the embodiment, it is possible to obtain the mask 110 of undercut shape and of small width while preventing peeling of or damage to the first and second layers 102 and 103 that are to be the mask 110.

Next, a method of forming a patterned thin film of the embodiment will now be described. The method is to form a patterned thin film through the use of the mask 110 formed by the mask-forming method of the embodiment described above. Description will now be given as to the cases where the method of forming a patterned thin film of the embodiment is applied to the etching method, the liftoff method, and the combination method.

Figure 9:
FIG. 9 is a cross section for illustrating a step of a method of forming a patterned thin-film of the embodiment of the invention as applied to the etching method.
Figure 10:
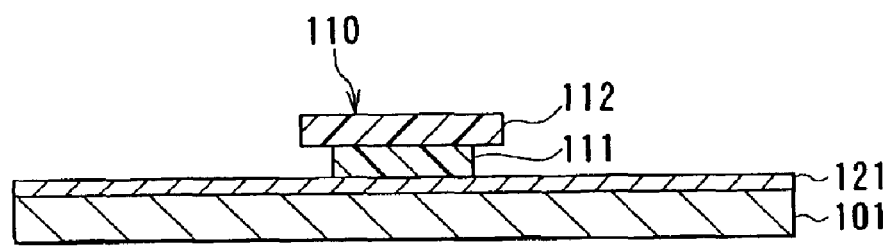
FIG. 10 is a cross section for illustrating a step that follows FIG. 9.
Figure 11:
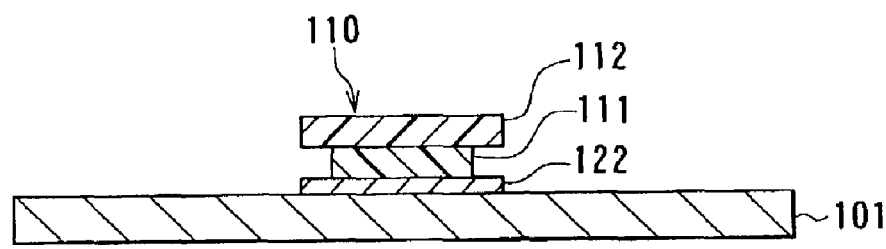
FIG. 11 is a cross section for illustrating a step that follows FIG. 10.
Figure 12:
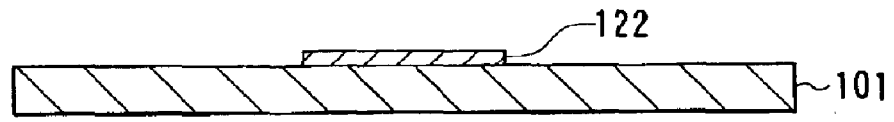
FIG. 12 is a cross section for illustrating a step that follows FIG. 11.

Reference is now made to FIG. 9 to FIG. 12 to describe the method of forming a patterned thin film as applied to the etching method. In this case, as shown in FIG. 9, a film 121 to be patterned is first formed on the base layer 101. Next, as shown in FIG. 10, the mask 110 of undercut shape is formed on the film 121 by the mask-forming method of the embodiment. Next, as shown in FIG. 11, the film 121 is selectively etched by dry etching such as ion milling through the use of the mask 110, to thereby form a patterned thin film 122 having a desired shape. Next, as shown in FIG. 12, the mask 110 is removed.

Figure 13:
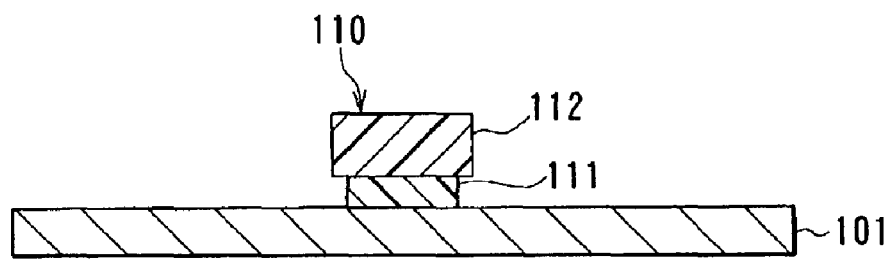
FIG. 13 is a cross section for illustrating a step of the method of forming a patterned thin-film of the embodiment as applied to the liftoff method.
Figure 14:
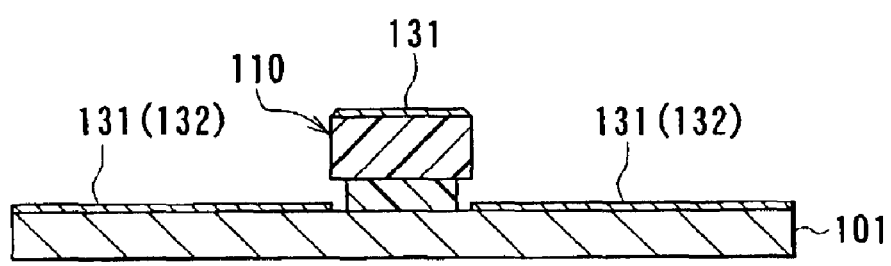
FIG. 14 is a cross section for illustrating a step that follows FIG. 13.
Figure 15:
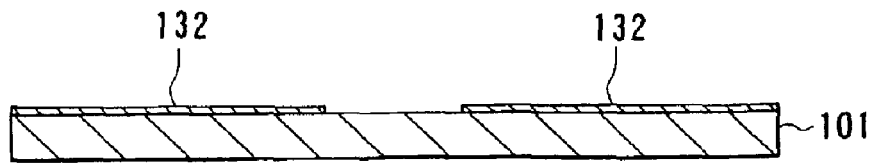
FIG. 15 is a cross section for illustrating a step that follows FIG. 14.

Reference is now made to FIG. 13 to FIG. 15 to describe the method of forming a patterned thin film as applied to the liftoff method. In this case, as shown in FIG. 13, the mask 110 of undercut shape is first formed on the base layer 101. Next, as shown in FIG. 14, a film 131 to be patterned is formed over the entire surface on top of the base layer 101 and the mask 110, to thereby form a patterned thin film 132 from the film 131. Next, as shown in FIG. 15, the mask 110 is removed. The patterned thin film 132 having a desired shape is thus obtained.

Figure 16:
FIG. 16 is a cross section for illustrating a step of the method of forming a patterned thin-film of the embodiment as applied to the combination method.
Figure 17:
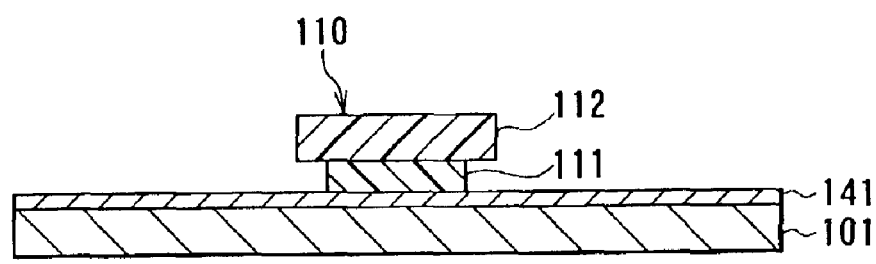
FIG. 17 is a cross section for illustrating a step that follows FIG. 16.
Figure 18:
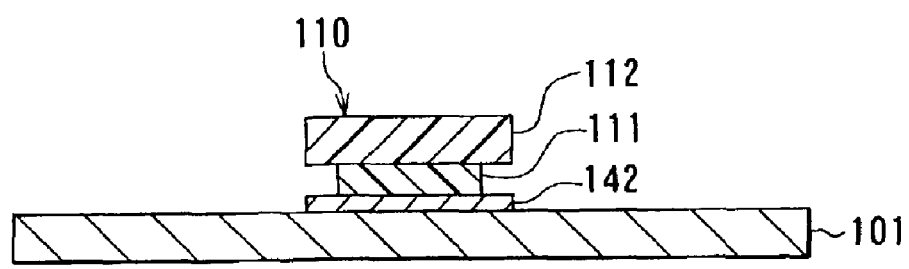
FIG. 18 is a cross section for illustrating a step that follows FIG. 17.
Figure 19:
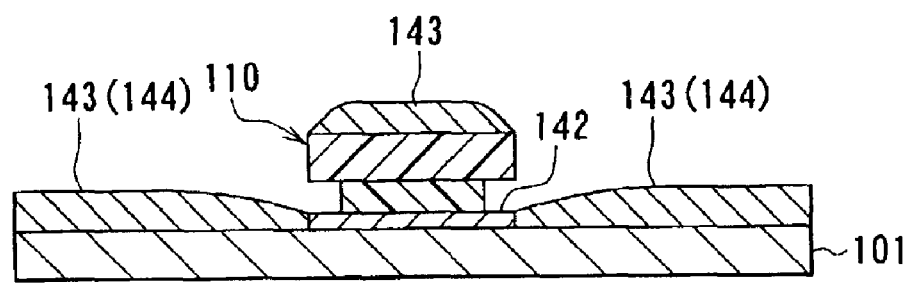
FIG. 19 is a cross section for illustrating a step that follows FIG. 18.
Figure 20:
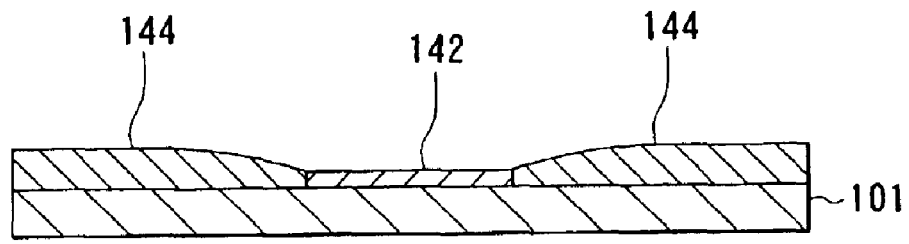
FIG. 20 is a cross section for illustrating a step that follows FIG. 19.

Reference is now made to FIG. 16 to FIG. 20 to describe the method of forming a patterned thin film as applied to the combination method. In this case, as shown in FIG. 16, a first film 141 to be patterned is first formed on the base layer 101. Next, as shown in FIG. 17, the mask 110 of undercut shape is formed on the film 141 by the mask-forming method of the embodiment. Next, as shown in FIG. 18, the film 141 is selectively etched by dry etching such as ion milling through the use of the mask 110, to thereby form a first patterned thin film 142 having a desired shape. Next, as shown in FIG. 19, a second film 143 to be patterned is formed over the entire surface on top of the base layer 101 and the mask 110, to thereby form a second patterned thin film 144 from the film 143 on the base layer 101. Next, as shown in FIG. 20, the mask 110 is removed. Thus, the second patterned thin film 144 having a desired shape is obtained. According to this method, it is possible to form the first patterned thin film 142 and the second patterned thin film 144 to be contiguous to each other on the base layer 101.

In the method of forming a patterned thin film of the embodiment, a patterned thin film is formed through the use of the mask 110 that is formed by the mask-forming method of the embodiment. As a result, it is possible to form a fine patterned thin film.

Description will now be given of an example in which the method of forming a patterned thin film of the embodiment is applied to a method of fabricating a thin-film magnetic head as an example of the micro device. In this example, described is a thin-film magnetic head that comprises a read head incorporating a spin valve giant magnetoresistive (GMR) element.

Reference is now made to FIGS. 21A to 26A and FIGS. 21B to 26B to describe an outline of the method of fabricating a thin film magnetic head. FIGS. 21A to 26A are cross sections each orthogonal to the air bearing surface. FIGS. 21B to 26B are cross sections of the magnetic pole portion each parallel to the air bearing surface.

In the method of fabricating the thin-film magnetic head of the example, as shown in FIGS. 21A and 21B, an insulating layer 2 of an insulating material such as alumina ($Al_2O_3$) is formed to a thickness of 1 to 5 $\mu$m, for example, by sputtering or the like on a substrate 1 of a ceramic material such as aluminum oxide and titanium carbide ($Al_2O_3$—TiC). On the insulating layer 2, a bottom shield layer 3 of a magnetic material such as Permalloy (NiFe) is formed to a thickness of about 3 $\mu$m, for example, by sputtering, plating or the like, for making the read head.

On the bottom shield layer 3, a bottom shield gap film 4 of an insulating material such as alumina is formed to a thickness of 10 to 200 nm, for example, by sputtering or the like. Then, using the method of forming a patterned thin film of the embodiment, a GMR element 5 for reproduction and lead layers 6 are each formed to a thickness of tens of nanometers on the bottom shield gap film 4. The GMR element 5 corresponds to the patterned thin film 122 or the first patterned thin film 142 of the embodiment, and the lead layers 6 correspond to the patterned thin film 132 or the second patterned thin film 144.

On the bottom shield gap film 4 and the GMR element 5, a top shield gap film 7 of an insulating material such as alumina is formed to a thickness of 10 to 200 nm, for example, by sputtering or the like.

On the top shield gap film 7, a top-shield-layer-cum-bottom-pole-layer (hereinafter called a bottom pole layer) 8 is formed to a thickness of 3 to 4 $\mu$m, for example, by sputtering or plating or the like. The bottom pole layer 8 is made of a magnetic material and used for both read head and write head. The magnetic material used for the bottom pole layer 8 is a soft magnetic material such as NiFe, CoFe, CoFeNi, and FeN.

In place of the bottom pole layer 8, there may be provided a top shield layer, a separation layer made of a nonmagnetic material such as alumina and formed on the top shield layer by sputtering or the like, and a bottom pole layer formed on the separation layer.

Next, as shown in FIGS. 22A and 22B, a write gap layer 9 of an insulating material such as alumina is formed on the bottom pole layer 8 to a thickness of 50 to 300 nm, for example, by sputtering or the like. Next, a portion of the write gap layer 9 located in the center portion of a thin-film coil to be described later is etched to form a contact hole 9a for making a magnetic path.

On the write gap layer 9, a first layer 10 of the thin-film coil made of copper (Cu), for example, is formed to a thickness of 2 to 3 $\mu$m, for example. In FIG. 22A, reference numeral 10a represents a connecting portion of the first layer 10 to be connected to a second layer 15 of the thin-film coil described later. The first layer 10 of the coil is wound around the contact hole 9a.

Next, as shown in FIGS. 23A and 23B, an insulating layer 11 is formed in a predetermined pattern to cover the first layer 10 of the coil and portions of the write gap layer 9 around the same. The insulating layer 11 is made of an organic insulating material which exhibits fluidity when heated, such as photoresist. Heat treatment is then performed at a predetermined temperature to flatten the surface of the insulating layer 11. As a result of the heat treatment, each of the outer and inner circumferential ends of the insulating layer 11 has a rounded and inclined surface configuration.

On the write gap layer 9 and the insulating layer 11, a track width defining layer 12a of a top pole layer 12 is formed using a magnetic material for making a write head. The track width defining layer 12a extends from an inclined portion of the insulating layer 11 on a side of an air bearing surface 20 (the left side of FIG. 23A) to be described later to the air bearing surface 20. The top pole layer 12 is made up of the track width defining layer 12a, and a coupling portion layer 12b and a yoke portion layer 12c to be described later. The track width defining layer 12a is formed by plating, for example.

The track width defining layer 12a has an end portion $12a_1$, and a connecting portion $12a_2$. The end portion $12a_1$ is formed on the write gap layer 9 and serves as the magnetic pole portion of the top pole layer 12. The connecting portion $12a_2$ is formed on the inclined portion of the insulating layer 11 on the side of the air bearing surface 20 and is connected to the yoke portion layer 12c. The width of the end portion $12a_1$ is equal to the write track width. That is, the end portion $12a_1$ defines the write track width. The width of the connecting portion $12a_2$ is greater than that of the end portion $12a_1$.

Concurrently with the formation of the track width defining layer 12a, the coupling portion layer 12b is formed on the contact hole 9a and a connecting layer 13 is formed on the connecting portion 10a. The coupling portion layer 12b is made of a magnetic material and constitutes a portion of the top pole layer 12 that is magnetically coupled to the bottom pole layer 8. The connecting layer 13 is made of a magnetic material.

Then, the write gap layer 9 and at least part of the magnetic pole portion of the bottom pole layer 8 located on the side of the write gap layer 9 are etched around the track width defining layer 12a, using the track width defining layer 12a as a mask. For example, reactive ion etching is used to etch the write gap layer 9, and ion milling is used to etch the bottom pole layer 8. The resultant structure as shown in FIG. 23B is called a trim structure, in which sidewalls of the magnetic pole portion of the top pole layer 12 (the end portion $12a_1$ of the track width defining layer 12a), the write gap layer 9 and at least part of the magnetic pole portion of the bottom pole layer 8 are formed vertically in a self-aligned manner.

Next, as shown in FIGS. 24A and 24B, an insulating layer 14 of an inorganic insulating material such as alumina is formed over the entire surface to a thickness of 3 to 4 μm, for example. The insulating layer 14 is then polished by chemical mechanical polishing, for example, so that the track width defining layer 12a, the coupling portion layer 12b and the connecting layer 13 are exposed, and the surface is flattened.

Figures 25A, 25B:
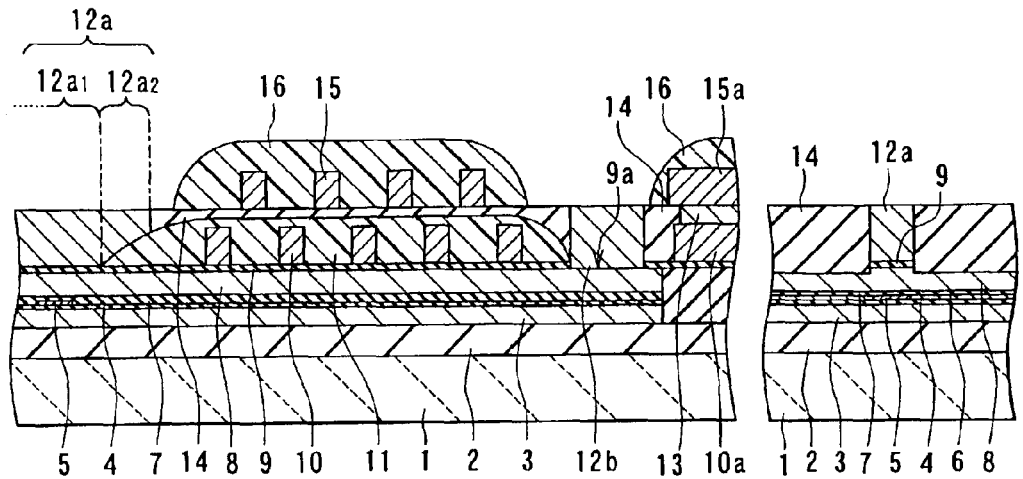
FIGS. 25A and 25B are cross sections for illustrating a step that follows FIGS. 24A and 24B.

Next, as shown in FIGS. 25A and 25B, the second layer 15 of the thin-film coil made of copper (Cu), for example, is formed on the flattened insulating layer 14 to a thickness of 2 to 3 μm, for example. In FIG. 25A, reference numeral 15a represents a connecting portion of the second layer 15 that is connected to the connecting portion 10a of the first layer 10 via the connecting layer 13. The second layer 15 is wound around the coupling portion layer 12b.

Next, an insulating layer 16 is formed in a predetermined pattern so as to cover the second layer 15 of the thin-film coil and portions of the insulating layer 14 around the same. The insulating layer 16 is made of an organic insulating material which exhibits fluidity when heated, such as photoresist.

Then, heat treatment is performed at a predetermined temperature to flatten the surface of the insulating layer 16. As a result of the heat treatment, each of the inner and outer circumferential ends of the insulating layer 16 has a rounded and inclined surface configuration.

Figures 26A, 26B:
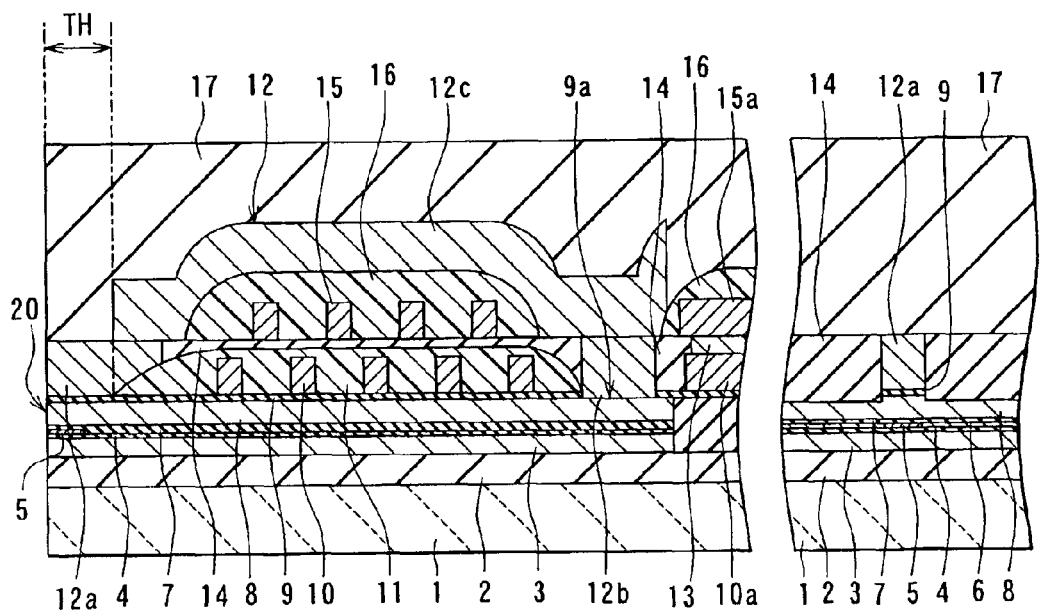
FIGS. 26A and 26B are cross sections for illustrating a step that follows FIGS. 25A and 25B.

Next, as shown in FIGS. 26A and 26B, the yoke portion layer 12c is formed on the track width defining layer 12a, the insulating layers 14 and 16 and the coupling portion layer 12b. The yoke portion layer 12c is made of a magnetic material used for making the write head, such as Permalloy, and constitutes a yoke portion of the top pole layer 12. An end of the yoke portion layer 12c facing the air bearing surface 20 is located at a distance from the air bearing surface 20. The yoke portion layer 12c is connected to the bottom pole layer 8 via the coupling portion layer 12b.

Next, an overcoat layer 17 of alumina, for example, is formed to cover the entire surface. Finally, machine processing of the slider including the foregoing layers is performed to form the air bearing surface 20 of the thin-film magnetic head including the write head and the read head, thereby completing the thin-film magnetic head.

The thin-film magnetic head fabricated as described above comprises a medium facing surface (air bearing surface 20) that faces toward a recording medium, and the read head and the write head (induction-type electromagnetic transducer). The read head incorporates the GMR element 5, and the bottom shield layer 3 and the top shield layer (bottom pole layer 8) for shielding the GMR element 5. Portions of the bottom shield layer 3 and the top shield layer located on a side of the air bearing surface 20 are opposed to each other, the GMR element 5 being located between these portions.

The write head incorporates the bottom pole layer 8 and the top pole layer 12 magnetically coupled to each other, each of which includes at least one layer. The bottom pole layer 8 and the top pole layer 12 include the magnetic pole portions that are opposed to each other and located in regions of the pole layers on a side of the air bearing surface 20. The write head further incorporates the write gap layer 9 provided between the magnetic pole portions of the bottom and top pole layers 8 and 12, and the thin-film coil including the first and second layers 10 and 15, at least part of the coil being disposed between the bottom and top pole layers 8 and 12 and insulated from the bottom and top pole layers 8 and 12. In the thin-film magnetic head of the embodiment, as shown in FIG. 26A, the length from the air bearing surface 20 to the air-bearing-surface-side end of the insulating layer 11 is a throat height TH. The throat height is the length (height) of portions of the two pole layers opposed to each other with the write gap layer in between, as taken from the air-bearing-surface-side end to the other end.

Reference is now made to FIG. 27 through FIG. 30 to describe an example of a method of fabricating the read head of the above-described thin-film magnetic head. FIG. 27 through FIG. 30 are cross sections of the magnetic pole portion each parallel to the air bearing surface (medium facing surface).

Figure 27:
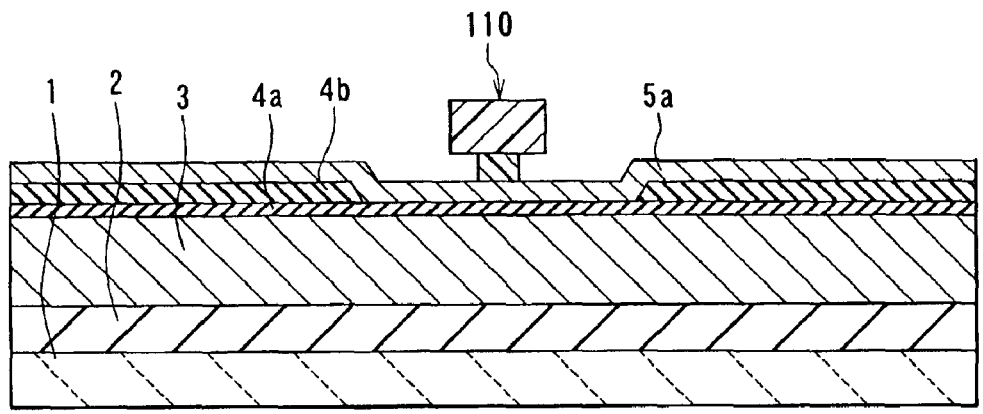
FIG. 27 is a cross section for illustrating a step of a method of fabricating a read head of the embodiment of the invention.

In the method of fabricating the read head of this example, as shown in FIG. 27, the insulating layer 2 is formed on the substrate 1, and then the bottom shield layer 3 is formed on the insulating layer 2. Next, a first shield gap film 4a made of an insulating material such as alumina is formed on the bottom shield layer 3. Next, a second shield gap film 4b made of an insulating material such as alumina is formed on the first shield gap film 104a except a region where to form the GMR element described later. The first shield gap film 4a and the second shield gap film 4b correspond to the bottom shield gap film 4 shown in FIGS. 26A and 26B. Next, a layer 5a to be the GMR element for reproduction is formed on the second shield gap film 4b. On the layer 5a, the mask 110 of undercut shape is formed in the region where to form the GMR element, by using the mask-forming method of the embodiment.

Figure 28:
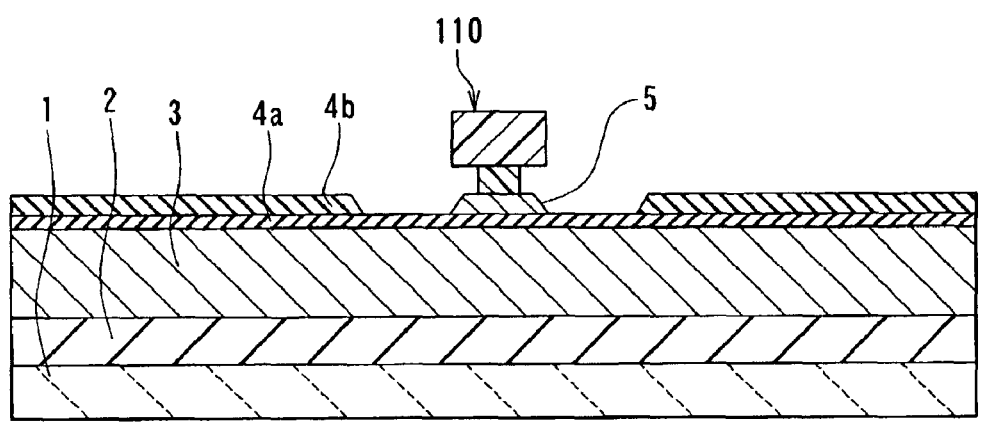
FIG. 28 is a cross section for illustrating a step that follows FIG. 27.

Next, as shown in FIG. 28, the layer 5a is selectively etched by, e.g., ion milling through the use of the mask 110, thereby forming the GMR element 5. Thus, the GMR element 5 is formed by the etching method.

Figure 29:
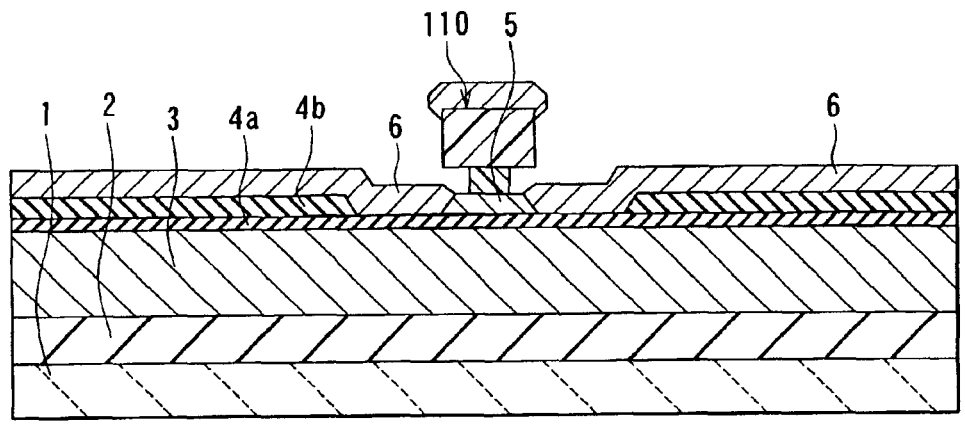
FIG. 29 is a cross section for illustrating a step that follows FIG. 28.

Next, as shown in FIG. 29, a pair of lead layers 6 to be connected to the GMR element 5 are formed into specific shapes over the top surfaces of the first shield gap film 4a, the second shield gap film 4b and the mask 110. The mask 110 is then removed. Thus, the lead layers 6 are formed by the liftoff method. It can also be said that the GMR element 5 and the lead layers 6 are formed by the combination method.

Figure 30:
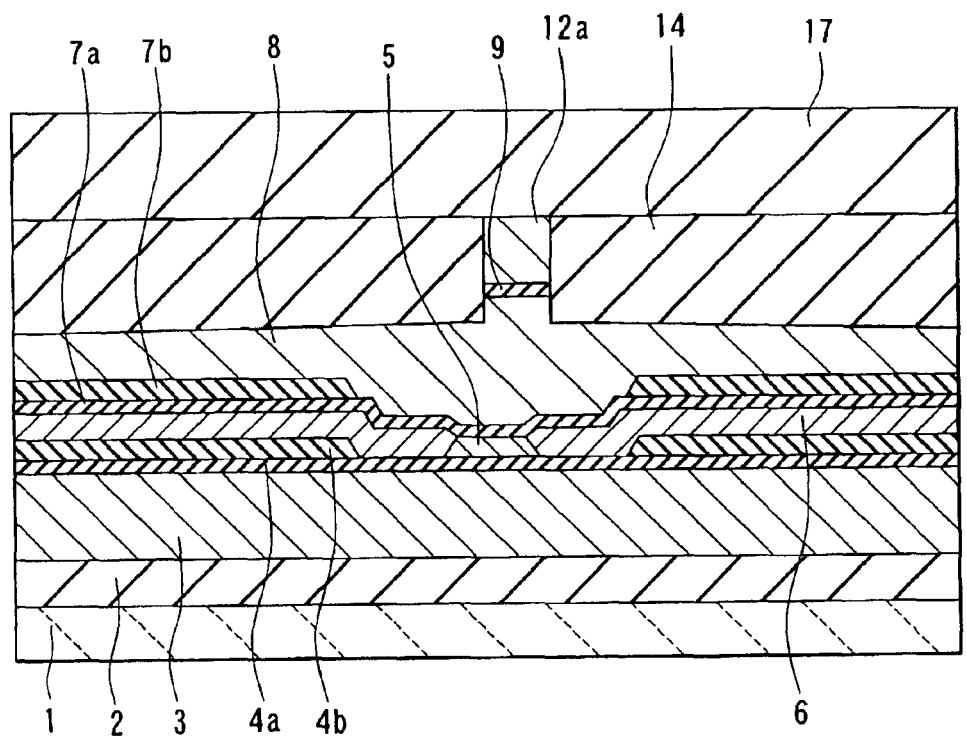
FIG. 30 is a cross section for illustrating a step that follows FIG. 29.

Next, as shown in FIG. 30, a third shield gap film 7a made of an insulating material such as alumina is formed on the shield gap films 4a and 4b, the GMR element 5 and the lead layers 6. The GMR element 5 is embedded in the shield gap films 4a and 7a. Next, a fourth shield gap film 7b made of an insulating material such as alumina is formed on the third shield gap film 7a except the neighborhood of the GMR element 5. The third shield gap film 7a and the fourth shield gap film 7b correspond to the top shield gap film 7 shown in FIGS. 26A and 26B. Next, the bottom pole layer 8 is formed on the shield gap films 7a and 7b. Subsequent steps for fabricating the thin-film magnetic head are as described with reference to FIGS. 22A to 26A and FIGS. 22B to 26B.

Figure 31:
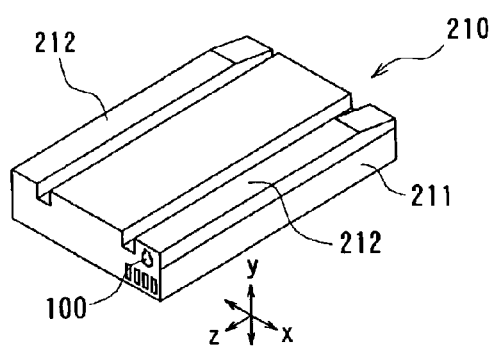
FIG. 31 is a perspective view that illustrates a slider incorporated in a head gimbal assembly of the embodiment of the invention.

Description will now be given of a head gimbal assembly and a hard disk drive to which the thin-film magnetic head of the embodiment is applied. First, a slider 210 incorporated in the head gimbal assembly will be described with reference to FIG. 31. In the hard disk drive, the slider 210 is placed to face toward a hard disk platter that is a circular-plate-shaped recording medium to be rotated and driven. The slider 210 has a base body 211 made up mainly of the substrate 1 and the overcoat layer 17 of FIGS. 26A and 26B. The base body 211 is nearly hexahedron-shaped. One of the six surfaces of the base body 211 faces toward the hard disk platter. Rails 212 are formed in this one of the surfaces. A surface of each of the rails 212 functions as the air bearing surface. A tapered portion or a stepped portion is formed near the air-inflow-side end (the end located at the upper right of FIG. 31) of each of the rails 212. When the hard disk platter rotates in the z direction of FIG. 31, an airflow goes into the tapered portion or stepped portion and passes between the hard disk platter and the slider 210. A lift is thus created below the slider 210 in the y direction of FIG. 31 by the airflow and is exerted on the slider 210. The slider 210 flies over the hard disk platter by means of the lift. The x direction of FIG. 31 is across the track of the hard disk platter. A thin-film magnetic head 100 according to the embodiment is formed near the air-outflow-side end (the end located at the lower left of FIG. 31) of the slider 210.

Figure 32:
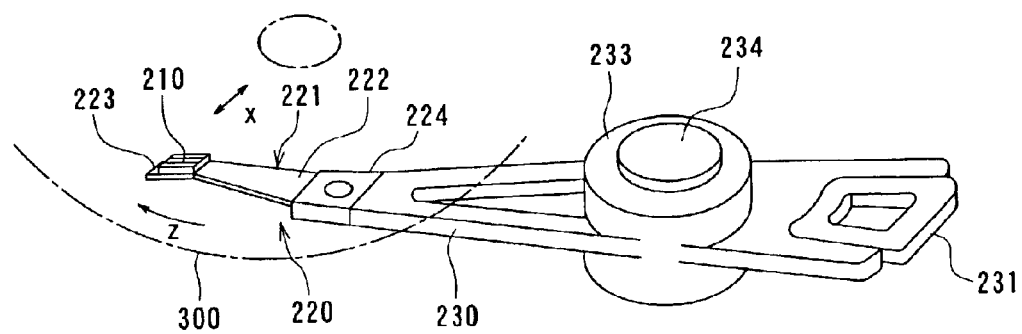
FIG. 32 is a perspective view that illustrates a head arm assembly including the head gimbal assembly of the embodiment.

Reference is now made to FIG. 32 to describe a head gimbal assembly 220 of the embodiment. The head gimbal assembly 220 comprises the slider 210 and a suspension 221 that flexibly supports the slider 210. The suspension 221 incorporates: a plate-spring-shaped load beam 222 made of stainless steel, for example; a flexure 223 to which the slider 210 is joined, the flexure being located at an end of the load beam 222 and giving an appropriate degree of freedom to the slider 210; and a base plate 224 located at the other end of the load beam 222. The base plate 224 is attached to an arm 230 of an actuator that moves the slider 210 along the x direction across the track of the hard disk platter 300. The actuator incorporates the arm 230 and a voice coil motor that drives the arm 230. A gimbal section that maintains the orientation of the slider 210 is provided in the portion of the flexure 223 on which the slider 210 is mounted.

The head gimbal assembly 220 is attached to the arm 230 of the actuator. An assembled body comprising the arm 230 and the head gimbal assembly 220 attached to the arm 230 is called a head arm assembly. An assembled body comprising a plurality of head gimbal assemblies 220 and a carriage with a plurality of arms is called a head stack assembly, in which the head gimbal assemblies 220 are attached to the arms of the carriage.

FIG. 32 illustrates an example of the head arm assembly. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to an axis 234 that rotatably supports the arm 230.

Figure 33:
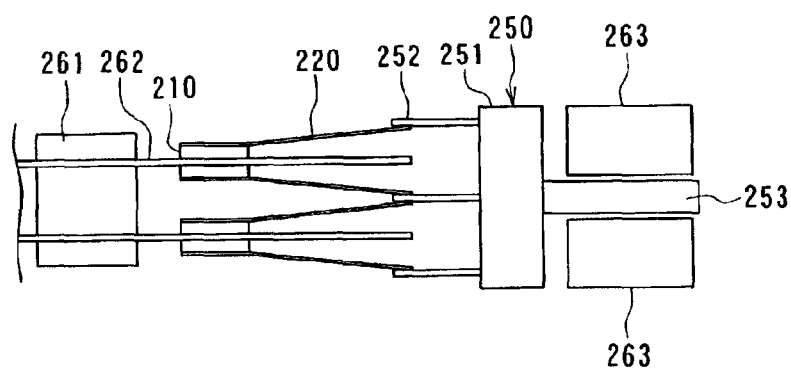
FIG. 33 illustrates a main part of a hard disk drive of the embodiment.
Figure 34:
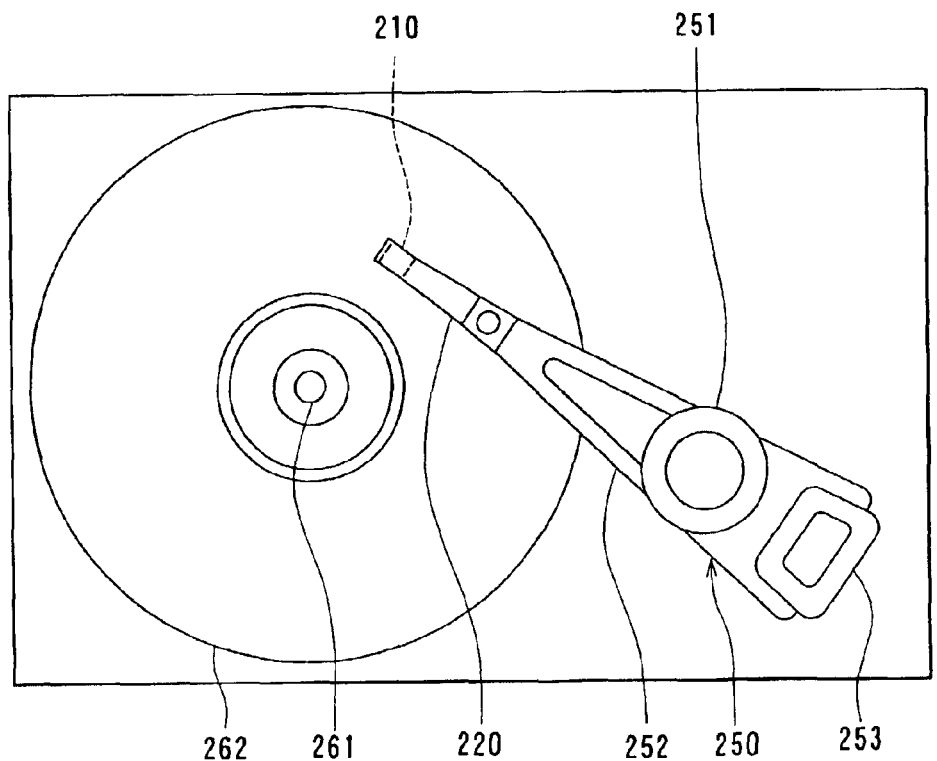
FIG. 34 is a top view of the hard disk drive of the embodiment.
Figure 35:
FIG. 35 is a cross section for illustrating a step of a related-art method of forming a mask of undercut shape through the use of a two-layer resist.
Figure 36:
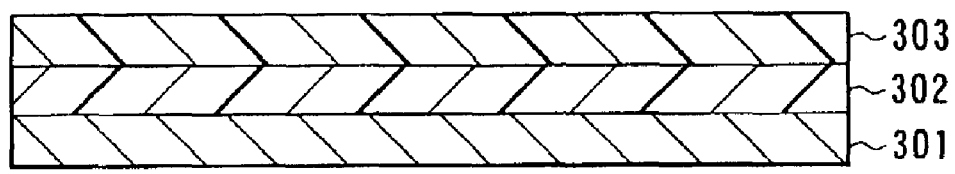
FIG. 36 is a cross section for illustrating a step that follows FIG. 35.
Figure 37:
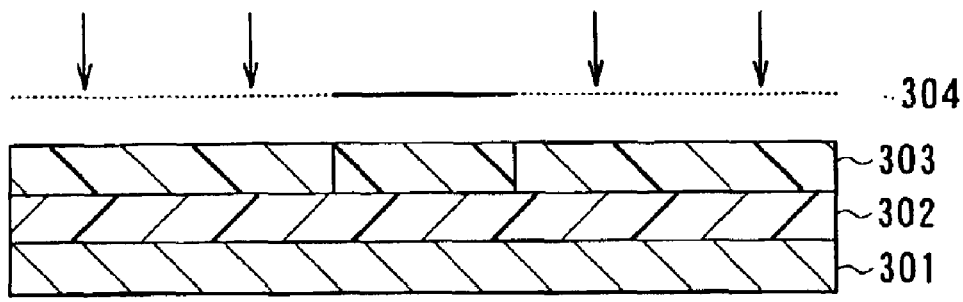
FIG. 37 is a cross section for illustrating a step that follows FIG. 36.
Figure 38:
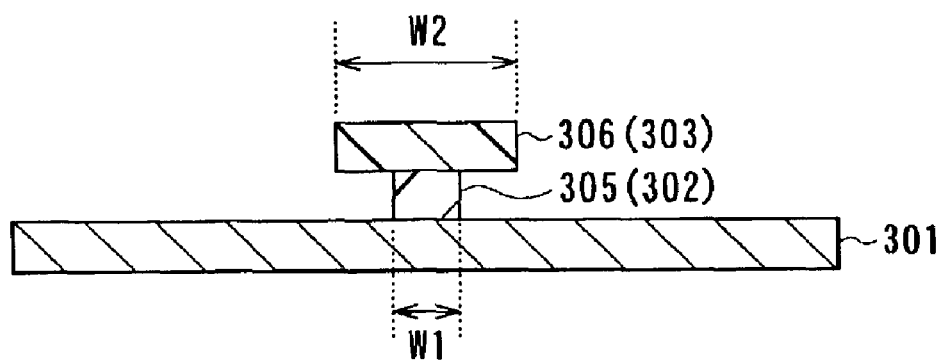
FIG. 38 is a cross section for illustrating a step that follows FIG. 37.

Reference is now made to FIG. 33 and FIG. 34 to describe an example of the head stack assembly and the hard disk drive of the embodiment. FIG. 33 illustrates the main part of the hard disk drive. FIG. 34 is a top view of the hard disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between adjacent ones. A coil 253 that is part of the voice coil motor is mounted on the carriage 251 on a side opposite to the arms 252. The head stack assembly 250 is installed in the hard disk drive. The hard disk drive includes a plurality of hard disk platters 262 mounted on a spindle motor 261. Two of the sliders 210 are allocated to each of the platters 262, such that the two sliders 210 face each other with each of the platters 262 in between. The voice coil motor includes permanent magnets 263 located to face each other, the coil 253 of the head stack assembly 250 being placed between the magnets 263.

The head stack assembly 250 except the slider 210 and the actuator support the slider 210 and align it with respect to the hard disk platter 262.

In the hard disk drive of the embodiment, the actuator moves the slider 210 across the track of the hard disk platter 262 and aligns the slider 210 with respect to the platter 262. The thin-film magnetic head incorporated in the slider 210 writes data on the platter 262 through the use of the write head and reads data stored on the platter 262 through the use of the read head.

The present invention is not limited to the aforementioned embodiment but may be practiced in still other ways. For example, the invention is also applicable to a method of fabricating a micro device other than a thin-film magnetic head, such as a semiconductor device and a sensor or actuator incorporating a thin film.

According to the mask-forming method of the invention, in the step of developing the second layer and dissolving part of the first layer, the width of the remainder of the first layer is made equal to or greater than that of the second layer having undergone the development. After this step, ashing is performed on the first layer and the second layer so that the first layer having undergone the ashing has a width smaller than that of the second layer having undergone the ashing.

A mask of undercut shape is thereby obtained. Thus, this method makes it possible to obtain a mask of undercut shape and of small width while preventing peeling of or damage to the layers to make the mask.

In the method of forming a patterned thin film or the method of fabricating a micro device according to the invention, the patterned thin film is formed by using the mask that is formed by the mask-forming method of the invention. As a result, according to the invention, it is possible to form a fine patterned thin film.

Obviously many modifications and variations of the present invention are possible in the light of the above teachings. It is therefore to be understood that within the scope of the appended claims the invention may be practiced otherwise than as specifically described.

What is claimed is:

1. A method of forming a mask to be used for forming a patterned thin film, the mask including: an upper layer made of a resist and having a specific width; and a lower layer having a width smaller than the width of the upper layer; the method comprising the steps of:

forming a first layer on a base layer, the first layer being made of a material that is soluble in a developer and has a higher removal rate in ashing than the resist;

forming a second layer made of the resist on the first layer;

exposing the second layer to light for forming a latent image of specific pattern;

developing the second layer having undergone the exposure and dissolving part of the first layer using the developer, so that the remainder of the first layer has a width equal to or greater than that of the second layer having undergone the development; and performing ashing on the remainder of the first layer and the second layer having undergone the development, so that the first layer having undergone the ashing has a width smaller than that of the second layer having undergone the ashing, to make the first layer having undergone the ashing serve as the lower layer and the second layer having undergone the ashing as the upper layer.

2. A method of forming a patterned thin film through the use of a mask of undercut shape, comprising the steps of:

forming a film to be patterned on a base layer;

forming the mask of undercut shape on the film to be patterned; and forming a patterned thin film from the film to be patterned, by selectively etching the film to be patterned through the use of the mask, wherein:

the mask includes an upper layer made of a resist and having a specific width, and a lower layer having a width smaller than the width of the upper layer, and the step of forming the mask includes the steps of:

forming a first layer on the base layer, the first layer being made of a material that is soluble in a developer and has a higher removal rate in ashing than the resist;

forming a second layer made of the resist on the first layer;

exposing the second layer to light for forming a latent image of specific pattern;

developing the second layer having undergone the exposure and dissolving part of the first layer using the developer, so that the remainder of the first layer has a width equal to or greater than that of the second layer having undergone the development; and performing ashing on the remainder of the first layer and the second layer having undergone the development, so that the first layer having undergone the ashing has a width smaller than that of the second layer having undergone the ashing, to make the first layer having undergone the ashing serve as the lower layer and the second layer having undergone the ashing as the upper layer.

3. A method of forming a patterned thin film through the use of a mask of undercut shape, comprising the steps of:

forming the mask of undercut shape on a base layer;

forming a film to be patterned over an entire surface on top of the base layer and the mask, to thereby form a patterned thin film from the film to be patterned on the base layer; and removing the mask after the patterned thin film is formed, wherein:

the mask includes an upper layer made of a resist and having a specific width, and a lower layer having a width smaller than the width of the upper layer, and the step of forming the mask includes the steps of:

forming a first layer on the base layer, the first layer being made of a material that is soluble in a developer and has a higher removal rate in ashing than the resist;

forming a second layer made of the resist on the first layer;

exposing the second layer to light for forming a latent image of specific pattern;

developing the second layer having undergone the exposure and dissolving part of the first layer using the developer, so that the remainder of the first layer has a width equal to or greater than that of the second layer having undergone the development; and performing ashing on the remainder of the first layer and the second layer having undergone the development, so that the first layer having undergone the ashing has a width smaller than that of the second layer having undergone the ashing, to make the first layer having undergone the ashing serve as the lower layer and the second layer having undergone the ashing as the upper layer.

4. A method of forming a patterned thin film through the use of a mask of undercut shape, comprising the steps of:

forming a first film to be patterned on a base layer;

forming the mask of undercut shape on the first film to be pattered;

forming a first patterned thin film from the first film to be patterned, by selectively etching the first film to be patterned through the use of the mask;

forming a second film to be patterned over an entire surface on top of the base layer and the mask after the first patterned thin film is formed, to thereby form a second patterned thin film from the second film to be patterned on the base layer; and removing the mask after the second patterned thin film is formed, wherein:

the mask includes an upper layer made of a resist and having a specific width, and a lower layer having a width smaller than the width of the upper layer, and the step of forming the mask includes the steps of:

forming a first layer on the base layer, the first layer being made of a material that is soluble in a developer and has a higher removal rate in ashing than the resist;

forming a second layer made of the resist on the first layer;

exposing the second layer to light for forming a latent image of specific pattern;

developing the second layer having undergone the exposure and dissolving part of the first layer using the developer, so that the remainder of the first layer has a width equal to or greater than that of the second layer having undergone the development; and performing ashing on the remainder of the first layer and the second layer having undergone the development, so that the first layer having undergone the ashing has a width smaller than that of the second layer having undergone the ashing, to make the first layer having undergone the ashing serve as the lower layer and the second layer having undergone the ashing as the upper layer.

5. A method of fabricating a micro device including one or more patterned thin films, comprising the steps of:

forming a film to be patterned on a base layer;

forming a mask of undercut shape on the film to be patterned; and forming a patterned thin film from the film to be patterned, by selectively etching the film to be patterned through the use of the mask, wherein:

the mask includes an upper layer made of a resist and having a specific width, and a lower layer having a width smaller than the width of the upper layer, and the step of forming the mask includes the steps of:

forming a first layer on the base layer, the first layer being made of a material that is soluble in a developer and has a higher removal rate in ashing than the resist;

forming a second layer made of the resist on the first layer;

exposing the second layer to light for forming a latent image of specific pattern;

developing the second layer having undergone the exposure and dissolving part of the first layer using the developer, so that the remainder of the first layer has a width equal to or greater than that of the second layer having undergone the development; and performing ashing on the remainder of the first layer and the second layer having undergone the development, so that the first layer having undergone the ashing has a width smaller than that of the second layer having undergone the ashing, to make the first layer having undergone the ashing serve as the lower layer and the second layer having undergone the ashing as the upper layer.

6. A method according to claim 5, wherein the micro device is a thin-film magnetic head.

7. A method according to claim 6, wherein the patterned thin film is a magnetoresistive element.

8. A method of fabricating a micro device including one or more patterned thin films, comprising the steps of:

forming a mask of undercut shape on a base layer;

forming a film to be patterned over an entire surface on top of the base layer and the mask, to thereby form a patterned thin film from the film to be patterned on the base layer; and removing the mask after the patterned thin film is formed, wherein:

the mask includes an upper layer made of a resist and having a specific width, and a lower layer having a width smaller than the width of the upper layer, and the step of forming the mask includes the steps of:

forming a first layer on the base layer, the first layer being made of a material that is soluble in a developer and has a higher removal rate in ashing than the resist;

forming a second layer made of the resist on the first layer;

exposing the second layer to light for forming a latent image of specific pattern;

developing the second layer having undergone the exposure and dissolving part of the first layer using the developer, so that the remainder of the first layer has a width equal to or greater than that of the second layer having undergone the development; and performing ashing on the remainder of the first layer and the second layer having undergone the development, so that the first layer having undergone the ashing has a width smaller than that of the second layer having undergone the ashing, to make the first layer having undergone the ashing serve as the lower layer and the second layer having undergone the ashing as the upper layer.

9. A method according to claim 8, wherein the micro device is a thin-film magnetic head.

10. A method according to claim 9, wherein the patterned thin film is a lead layer connected to a magnetoresistive element.

11. A method of fabricating a micro device including two or more patterned thin films, comprising the steps of:

forming a first film to be patterned on a base layer;

forming a mask of undercut shape on the first film to be pattered;

forming a first patterned thin film from the first film to be patterned, by selectively etching the first film to be patterned through the use of the mask;

forming a second film to be patterned over an entire surface on top of the base layer and the mask after the first patterned thin film is formed, to thereby form a second patterned thin film from the second film to be patterned on the base layer; and removing the mask after the second patterned thin film is formed, wherein:

the mask includes an upper layer made of a resist and having a specific width, and a lower layer having a width smaller than the width of the upper layer, and the step of forming the mask includes the steps of:

forming a first layer on the base layer, the first layer being made of a material that is soluble in a developer and has a higher removal rate in ashing than the resist;

forming a second layer made of the resist on the first layer;

exposing the second layer to light for forming a latent image of specific pattern;

developing the second layer having undergone the exposure and dissolving part of the first layer using the developer, so that the remainder of the first layer has a width equal to or greater than that of the second layer having undergone the development; and performing ashing on the remainder of the first layer and the second layer having undergone the development, so that the first layer having undergone the ashing has a width smaller than that of the second layer having undergone the ashing, to make the first layer having undergone the ashing serve as the lower layer and the second layer having undergone the ashing as the upper layer.

12. A method according to claim 11, wherein the micro device is a thin-film magnetic head.

13. A method according to claim 12, wherein the first patterned thin film is a magnetoresistive element, and the second patterned thin film is a lead layer connected to the magnetoresistive element.

* * * * *